United States Patent [19]

Norling

[11] Patent Number: 4,726,228

[45] Date of Patent: Feb. 23, 1988

[54] ACCELEROMETER PROOF MASS INTERFACE

[75] Inventor: Brian L. Norling, Mill Creek, Wash.

[73] Assignee: Sundstrand Data Control, Inc., Redmond, Wash.

[21] Appl. No.: 853,154

[22] Filed: Apr. 16, 1986

[51] Int. Cl.⁴ .................................... G01P 15/13
[52] U.S. Cl. ............................ 73/517 B; 73/497
[58] Field of Search ............. 73/497, 517 R, 517 B, 73/651; 310/25

[56] References Cited

U.S. PATENT DOCUMENTS

| | | | |
|---|---|---|---|
| 3,339,419 | 9/1967 | Wilcox | 73/517 B |
| 3,702,073 | 11/1972 | Jacobs | 73/517 B |
| 4,182,187 | 1/1980 | Hanson | 73/497 |
| 4,250,757 | 2/1981 | Hanson | 73/517 B |
| 4,592,234 | 1/1986 | Norling | 73/517 B |

Primary Examiner—John Chapman

Attorney, Agent, or Firm—Christensen, O'Connor, Johnson & Kindness

[57] ABSTRACT

An accelerometer with improved resistance to errors due to thermal stress. The accelerometer comprises a proof mass assembly (44), a stator (40), and an interface member (90) that includes a plate-like body positioned between the proof mass assembly and the stator. The proof mass assembly includes a reed (72) suspended from a support (70), and a reed capacitor plate positioned on the reed. The body includes a body capacitor plate (94) positioned to form a capacitor with the reed capacitor plate. The interface member includes first mounting member (110) for securely mounting a first area of the stator with respect to a corresponding first area of the support, and a mounting element (126) extending between a second area of the stator and a corresponding second area of the support. The mounting element is relatively compliant along a first axis, and relatively rigid along all other axes. The first axis lies in the plane of the body and passes approximately through the first mounting member.

6 Claims, 9 Drawing Figures

ACCELEROMETER PROOF MASS INTERFACE

LICENCE RIGHTS

This invention was made with Government support under Contract No. F33615-85-C-1741, awarded by the U.S. Air Force. The Government has certain rights in this invention.

FIELD OF THE INVENTION

The present invention relates to the field of force balancing instruments such as accelerometers.

BACKGROUND OF THE INVENTION

An example of a prior art accelerometer design with high performance potential is described in U.S. Pat. No. 3,702,073. The accelerometer described therein is comprised of three primary components, namely, a proof mass assembly and upper and lower stators or magnetic circuits between which the proof mass assembly is supported. The proof mass assembly includes a movable reed that is suspended via flexure elements to an outer annular support ring. The reed and support ring are commonly provided as a unitary structure composed of fused quartz.

Both upper and lower surfaces of the reed include capacitor plates and force restoring coils. Each force restoring coil is positioned on the reed such that the central axis of the coil coincides with a line that extends through the center of the reed and that is normal to the top and bottom surfaces of the reed. This line is coincident with the sensitive axis of the accelerometer. A plurality of mounting pads are formed at spaced apart positions around the upper and lower surfaces of the annular support ring. These mounting pads mate with inwardly facing surfaces of the upper and lower stators when the accelerometer is assembled.

Each stator is generally cylindrical, and has a bore provided in its inwardly facing surface. Contained within the bore is a permanent magnet. The bore and permanent magnet are configured such that an associated one of the force restoring coils of the proof mass assembly fits within the bore, with the permanent magnet being positioned within the cylindrical core of the force restoring coil. Current flowing through the coil therefore produces a magnetic field that interacts with the permanent magnet to produce a force on the reed. Also provided on the inwardly facing surfaces of the stators are capacitor plates configured to form capacitors with the upper and lower capacitor plates on the reed. Thus, movement of the reed with respect to the upper and lower stators results in a differential capacitance change.

In operation, the accelerometer is affixed to an object whose acceleration is to be measured. Acceleration of the object along the sensitive axis results in pendulous rotational displacement of the reed and coils with respect to the support ring and the stators. The resulting differential capacitance change caused by this displacement is sensed by a suitable feedback circuit. The feedback circuit then produces a current that, when applied to the force restoring coils, tends to return the reed to its neutral position. The magnitude of the current required to maintain the reed in its neutral position is directly related to the acceleration along the sensitive axis.

An important characteristic of an accelerometer of the type described above is its immunity to errors due to thermal stress. Thermal stress results from the fact that different parts of the accelerometer are composed of materials that have different coefficients of thermal expansion. For example, with a support ring composed of fused quartz and stators composed of a metal, temperature change will result in stress at the support ring/stator interfaces that can cause ring deformation and result in errors in the accelerometer output.

SUMMARY OF THE INVENTION

The present invention provides an accelerometer in which errors due to thermal stresses are minimized. In a preferred embodiment, the accelerometer of the present invention comprises a proof mass assembly, a stator, and interface means that includes a plate-like body positioned between the proof mass assembly and the stator. The proof mass assembly includes a reed suspended from a support for movement with respect thereto, and a reed capacitor plate positioned on the reed. The body comprises a body capacitor plate positioned to form a capacitor with the reed capacitor plate. The interface means also includes first mounting means for securely mounting a first area of the stator with respect to a corresponding first area of the support, and second mounting means comprising a mounting element extending between a second area of the stator and a corresponding second area of the support. The mounting element is relatively compliant along a first axis, and relatively rigid along all other axes. The first axis is oriented such that it lies in the plane of the body and passes approximately through the first mounting means. The mounting element is preferably mounted to the body by means of a torsion arm that permits rotation of the mounting element in response to differential thermal movement along the first axis between the stator and the support. The support for the body may be provided solely via the torsion arm. The support, body and mounting element are all preferably composed of fused quartz.

DETAILED DESCRIPTION OF THE INVENTION

Figure 1:
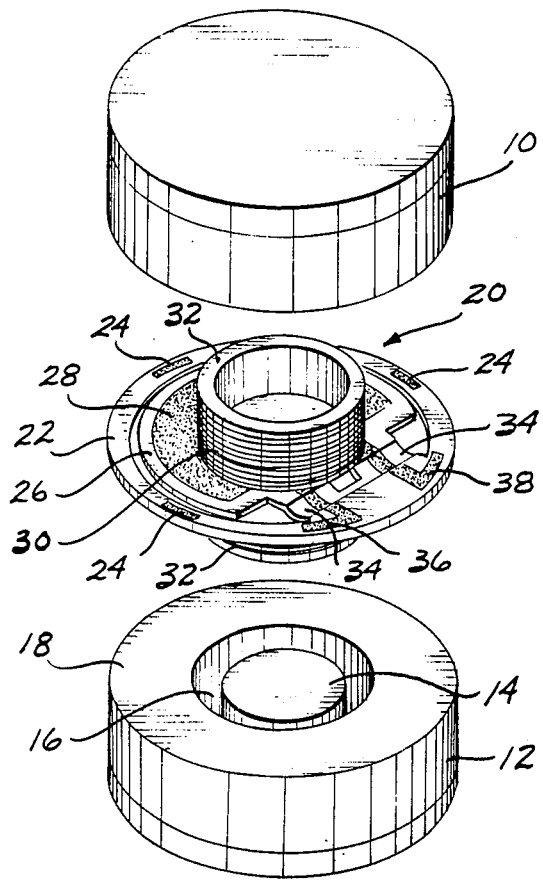
FIG. 1 is an exploded perspective view of a prior art accelerometer.

FIG. 1 illustrates an example of a force balancing accelerometer known in the prior art. This accelerometer includes an upper stator 10 and a lower stator 12. The inwardly facing surface of each stator includes a bore within which is positioned a permanent magnet capped by a pole piece, as illustrated by pole piece 14 within bore 16 of surface 18. Also shown in FIG. 1 is proof mass assembly 20 that is mounted between the upper and lower stators. Proof mass assembly 20 comprises outer annular support ring 22 and reed 26 supported from the support ring by flexures 34. The reed, flexures and support ring are preferably fabricated from a single piece of fused quartz. Support ring 22 includes three mounting pads 24 on its upper surface, and a similar set of three mounting pads (not shown) on its lower surface. When the accelerometer is assembled, mounting pads 24 contact the upper and lower stators, and provide support for the proof mass assembly.

Capacitor plate 28 is deposited on the upper surface of reed 26, and a similar capacitor plate (not shown) is deposited on the lower surface of reed 26. The capacitor plates cooperate with the inwardly facing surfaces of upper and lower stators 10 and 12 to provide a capacitive pick-off system. Also mounted on either side of reed 26 are coil forms 32 on which coils 30 are mounted. As is well understood in the servoed instrument art, coils 30 cooperate with the permanent magnets in the stators and with a suitable feedback circuit to retain reed 26 at a predetermined position with respect to support ring 22. Thin film pick-off leads 36 and 38, and similar leads (not shown) on the lower surface of proof mass assembly 20, provide electrical connections to the capacitor plates and force restoring coils.

An important objective in designing an accelerometer of the type shown in FIG. 1 is to minimize the stresses in flexure elements 34, including stresses due to differential thermal expansion of different parts of the accelerometer. In particular, support ring 22, reed 26 and flexures 34 are typically composed of fused quartz that has a coefficient of thermal expansion near zero. However, the portions of stators 10 and 12 that contact mounting pads 24 are preferably composed of a 36% nickel-iron alloy (Invar alloy) that has a coefficient of thermal expansion that is very low, but that is greater than that of fused quartz. Support ring 22 is clamped between two such stators. The mismatch in coefficient of thermal expansion between the support ring and stators creates strains as the temperature varies, which strains are primarily taken up by deformation of the support ring. Ring deformation can cause distortion of the flexures that may result in bias errors. Furthermore, deformation of the stators can distort the capacitor plates, resulting in an offset that will also create a bias error. Stator deformation may also sufficiently change the magnetic circuit to cause scale factor errors in the accelerometer output.

Figure 2:
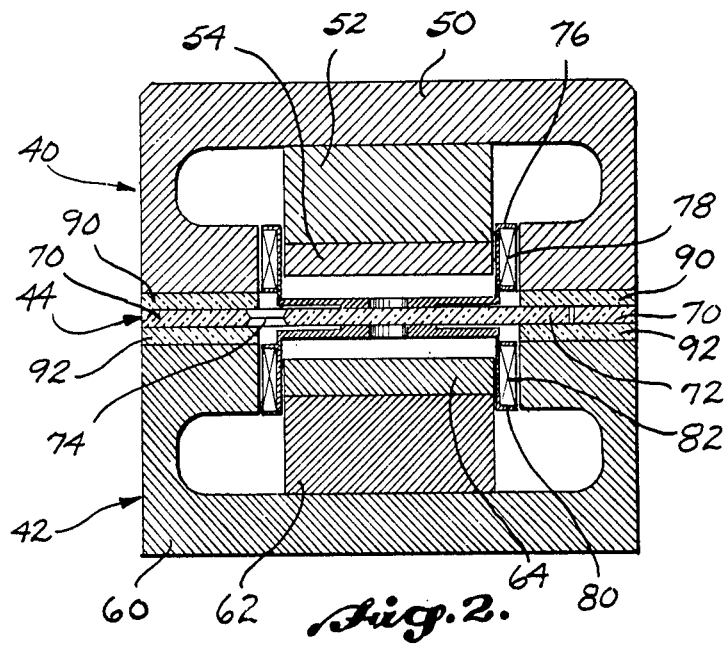
FIG. 2 is a cross-sectional view of an accelerometer according to the present invention.

FIGS. 2-5 illustrate a preferred embodiment of the accelerometer of the present invention. In this accelerometer, stresses due to differential thermal expansion between the stators and proof mass assembly are significantly reduced. Referring initially to FIG. 2, the accelerometer includes upper stator 40 and lower stator 42 between which proof mass assembly 44 is sandwiched. Upper stator 40 comprises Invar alloy excitation ring 50, magnet 52 and pole piece 54, and lower stator 42 similarly comprises Invar alloy excitation ring 60, magnet 62 and pole piece 64. Proof mass assembly 44 includes annular support ring 70 and reed 72 joined by flexures 74 (only one flexure shown in the cross section of FIG. 2). Coil form 76 is centrally positioned on the upper surface of reed 72 and contains coil 78 wound thereon. Similarly, coil form 80 that includes coil 82 is positioned on the lower surface of reed 72, in alignment with coil form 76. Each coil occupies a comparatively narrow gap between its respective pole piece and its respective excitation ring, to provide the force balancing function well known to those skilled in the art.

In order to isolate flexures 74 from stress due to differential thermal expansion, the accelerometer in FIG. 2 further includes upper plate 90 positioned between excitation ring 50 and proof mass assembly 44, and a substantially identical lower plate 92 positioned between excitation ring 60 and proof mass assembly 44. Plates 90 and 92 are composed of amorphous quartz, the same material that is used to fabricate support ring 70 and reed 72. This matching of materials eliminates thermal strains at the interface between the proof mass assembly and the plates. The lower surface of plate 90 includes a thin metallic electrode that combines with a capacitor plate on the upper surface of reed 72 to form a first capacitor. The upper surface of plate 92 also includes a thin metallic electrode that combines with a capacitor plate on the upper lower surface of reed 72 to form a second capacitor. The first and second capacitors are connected to a conventional pick-off circuit for detecting movement of the reed.

Figure 3:
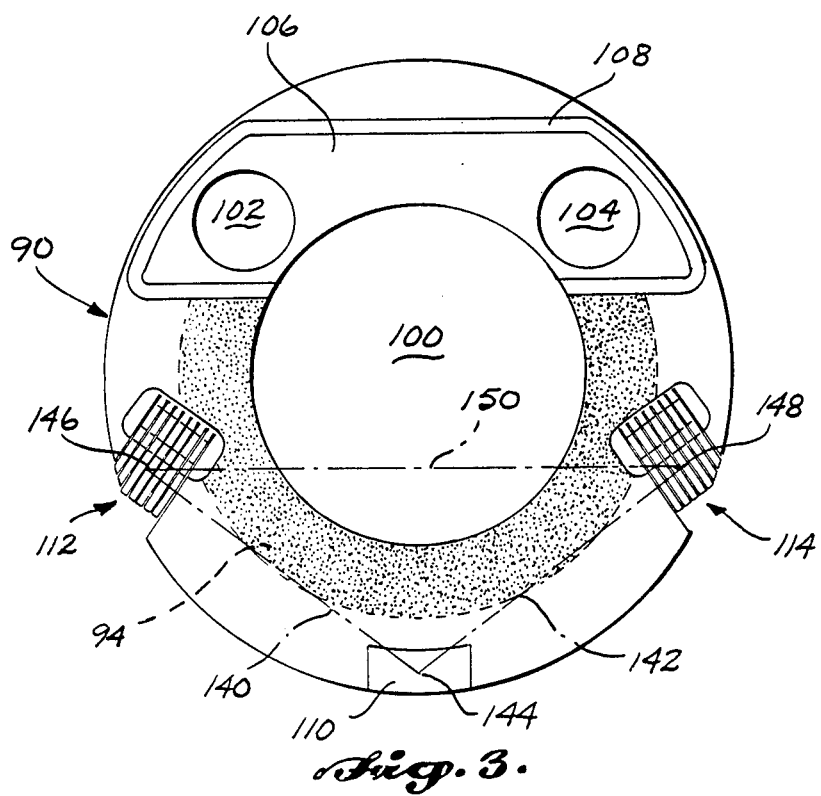
FIG. 3 is a bottom plan view of the upper plate.

Referring now primarily to FIG. 3, plate 90 is a generally ring-shaped structure having central opening 100. Plate 90 also includes smaller openings 102 and 104 that are provided to permit electrical connections to the proof mass assembly. Openings 102 and 104 are surrounded by recessed area 106 that is provided to permit wires to travel between the plate and proof mass assembly. Region 108 designates a sloping area between recessed area 106 and the remainder of plate 90. Region 94 represents the metallic electrode formed on the lower surface of plate 90 to form the upper plate of the first capacitor. As viewed in FIG. 3, the electrode represented by region 94 is on the opposite side of the plate.

Figure 5:
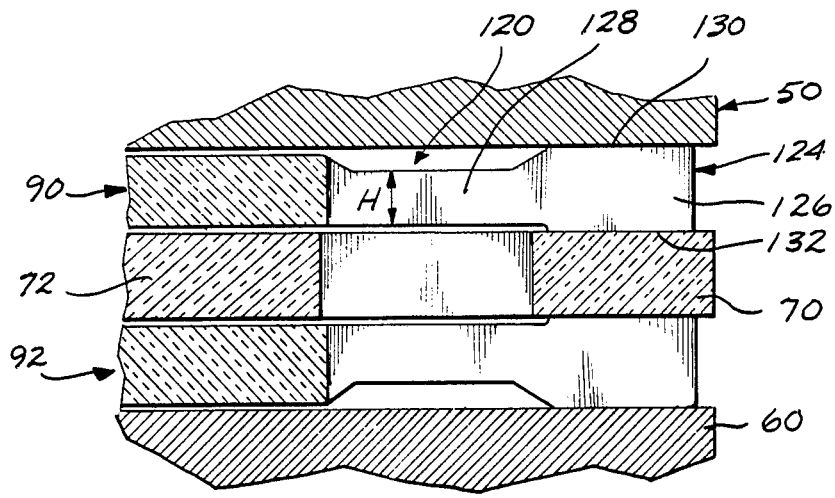
FIG. 5 is a cross-sectional view showing the interface between the excitation rings and proof mass assemblies.
Figure 4:
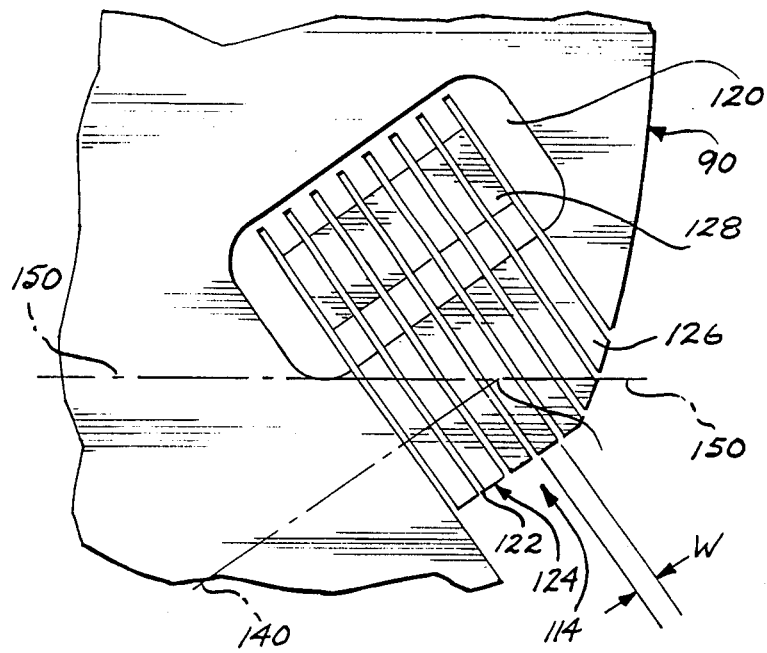
FIG. 4 is an enlarged view of one of the mounting assemblies.

In accordance with the present invention, mechanical connection between the stators and the proof mass assembly is entirely by way of mounting pads formed on plates 90 and 92. In particular, plate 90, shown in FIG. 3, includes fixed mounting pad 110 and flexible mounting assemblies 112 and 114. Mounting assembly 114 is shown in greater detail in FIG. 4. The mounting assembly is formed by etching recessed area 120 in the upper surface of plate 90, and then cutting a plurality of slots, such as slot 122, vertically through plate 90 to form a plurality of arms 124. As illustrated in FIGS. 4 and 5, arm 124 comprises wafer 126 connected to plate 90 via torsion bar 128 having height H and width W. The upper and lower surfaces of plate 90 are slightly recessed with respect to the upper surfaces of wafer 126. Wafer 126 thereby forms upper mounting pad 130 that contacts excitation ring 50, and lower pad 132 that contacts support ring 70 of proof mass assembly 44. Recessed area 120 is recessed to a greater extent than the upper surface of plate 90, to create torsion bar 128 that is sufficiently flexible to permit rotational movement and some translational movement of wafer 126 about the longitudinal axis of torsion bar 128. In some applications, recessed area 120 will not be necessary to produce torsion bars of appropriate stiffness.

Referring again to FIG. 3, mounting pad 110, and a similar mounting pad on the opposite side of plate 90, are slightly raised with respect to the surrounding portions of plate 90, to the same extent as mounting pads 130 and 132 shown in FIG. 5. Mounting pads 110 thereby form a fixed attachment point between stator 40 and proof mass assembly 44. The centroid of mounting pad 110 is designated by centroid point 144. The centroid of mounting pads 130 of the wafers of mounting assembly 112 is designated by centroid point 146, and centroid point 148 similarly designates the centroid of the mounting pads of mounting assembly 114. The individual wafers of mounting assembly 112 are oriented such that they are perpendicular to line 140 that extends between centroid point 144 and centroid point 146. The individual wafers of wafer assembly 114 are oriented perpendicular to line 142 drawn between centroid point 144 and centroid point 148. Centroid points 146 and 148 are preferably positioned such that line 150 joining these points passes through a line about which rotation of the proof mass assembly causes no change in differential capacitance used for movement detection. As a result of these arrangements, differential thermal expansion between excitation ring 50 and proof mass assembly 44 causes relative motion between the excitation ring and proof mass assembly along lines 140 and 142. In accordance with the present invention, this motion is accommodated by wafers 126, preferably by rotation of wafers 126 about torsion bars 128, thereby accommodating the relative motion while transmitting much less stress to the proof mass assembly.

Figure 6:
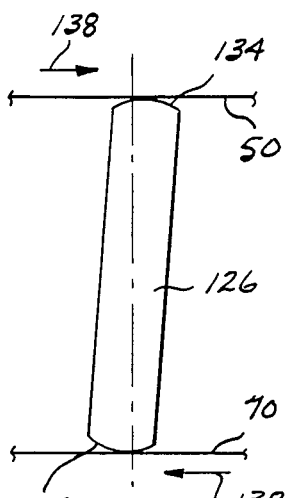
FIG. 6 is a schematic view showing rotation of a wafer having rounded contact surfaces.
Figure 7:
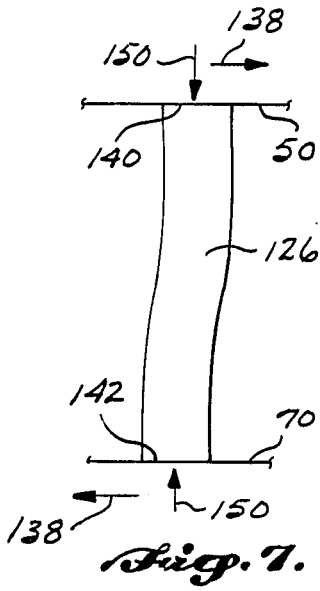
FIG. 7 is a schematic view showing S-bending of a wafer having rectangular contact surfaces.
Figure 8:
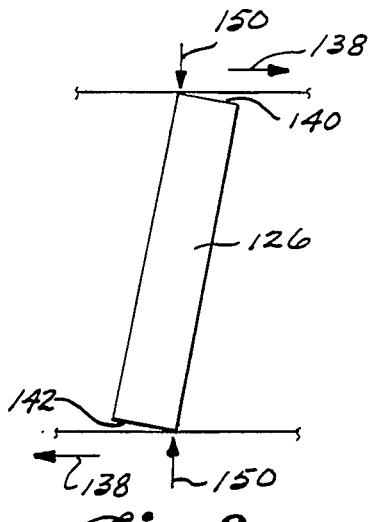
FIG. 8 is a schematic view showing rotational movement of a wafer with rectangular contact surfaces.

The rotation of wafers 126 occurs freely, except for the rotational and translational stiffness of torsion bars 128 and stiffness caused at the contact surfaces between the stator and proof mass assembly. If the contact surfaces of pads 130 and 132 are cylindrical, as illustrated by contact surfaces 134 and 136 in FIG. 6, then the contact surfaces do not contribute any additional rotational stiffness over and above that provided by the torsion bars. Arrows 138 represent forces generated by differential thermal expansion between excitation ring 50 and support ring 70. FIGS. 7 and 8 illustrate that if contact surfaces 140 and 142 of mounting pads 130 and 132, respectively, have a radius different from one-half of the height of wafer 126, then the pads may contribute additional rotational stiffness and reaction forces, depending upon the magnitude of the preload force. The preload force is the the force provided by the bellyband or other conventional means for holding the assembly of FIG. 2 together. In FIGS. 7 and 8, this preload force is represented by arrows 150. In the magnitude of the preload force is sufficiently great, or if the mounting pads are rigidly attached to excitation ring 50 and support ring 70 such as by bonding or brazing, then the mounting pads will remain in contact with the excitation ring and support ring, producing an S-bending of wafer 126, as shown in FIG. 7. FIG. 8 represents the situation in which the magnitude of the preload force is sufficiently small to permit the rotation of wafer 126. In general, the arrangement shown in FIG. 6 is perferred, since it minimizes the resistance of the wafer to rotation to accomodate differential thermal expansion. The arrangement shown in FIG. 8 has the disadvantage that it has a high preload sensitivity, and that it produces a propensity for the mounting pads to slip with respect to the excitation ring and support ring.

The amount of mismatch in thermal expansion is very small in a typical accelerometer and over normal temperature ranges. The amount of actual rotation of wafers 126 is, therefore, typically very small. The spacing between the upper and lower contact surfaces of wafer 126, and therefore between excitation ring 50 and support ring 70, varies approximately as a cosine function of wafer rotation angle. This spacing will therefore remain nearly constant as the excitation ring and proof mass assembly move relative to each other. This is an important consideration, because such spacing defines the capacitor gap, the damping gap, and the reed freedom of motion. The exact change in the spacing is defined by many design factors such as the wafer geometry, preload force, and elastic modulii of materials used. The use of rotatable wafers is analogous to placing roller bearings between the proof mass and stator to take up thermal strains. The proof mass assembly and stator therefore see a greatly reduced level of thermal stress. The pad interface also sees less stress and therefore is less likely to slip when exposed to shock and vibration.

Mounting pad 110 forms a rigid contact point between the support ring and the stators, thereby restraining all translational degrees of freedom of the proof mass assembly wih respect to the stators. Each of mounting assemblies 112 and 114 restrains two degrees of rotation of the proof mass assembly through direct compression of the wafers that prevents out of plane movement. The final rotational degree of freedom of the proof mass assembly (i.e., rotation in the plane of the reed about mounting pad 110) is restrained by direct shear across the long dimension of the wafers, a direction along which the wafers are extremely rigid. The rotational degree of freedom of the plate is restrained by the torsion bars. These bars are oriented perpendicularly to a line drawn between the centers of the mounting assemblies and mounting pad 110. Therefore, the torsion arms are put in direct tension and compression by this rotational mode, i.e., stiffness is maximized, under the assumption that all parts are infinitely rigid. This holds true no matter where the mounting assemblies are located. Out of plane movement of the plates is restrained by the translational beam stiffness of the torsion bars. In summary, the mounting arrangement provided by the present invention provides rigid restraint of all structures against all loadings except thermal expansion.

Figure 9:
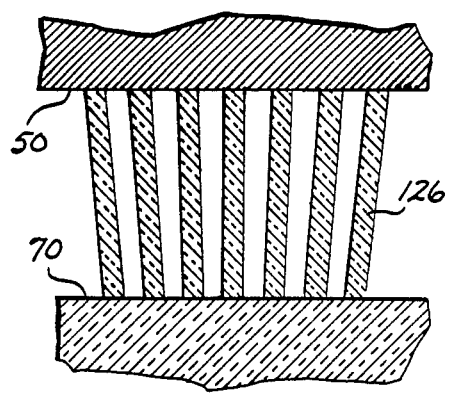
FIG. 9 is a schematic view showing the fan out of adjacent wafers due to differential thermal expansion.

The slotted wafer interface provides an additional benefit. Thermal expansion mismatch at the quartz/Invar alloy interface is allowed to occur with little stress in one axis because the wafers fan out, as shown in FIG. 9. The outer axis also sees some stress reduction because the wafers can contract in the orthogonal direction by Poison's ratio. The maximum shear stress on the pad interface is thus lower than an unslotted pad of the same size.

Torsion bars 128 are preferably dimensioned such that the height H is large compared to the width W, in order to maximize rigidity of the support for plate 90, while minimizing the stiffness of the torsion bar to rotation to accommodate support ring/stator differential thermal expansion. Preferably, each of mounting assemblies 112 and 114 comprise between one and fifty wafers. In the broad aspect of the present invention, wafers 126 need not form a part of plate 90. However the illustrated arrangement is preferred, inasmuch as it provides for positioning and support of the wafer, and also provides for the support of plate 90 and its electrode by the wafers when the accelerometer is assembled. Finally, it will be clear from the above description that more or less than two mounting assemblies may be employed, so long as the wafers are oriented as described above to provide thermal stress relief.

While the preferred embodiments of the invention have been illustrated and described, it should be understood that variations will be apparent to those skilled in the art. Accordingly, the invention is not to be limited to he specific embodiments illustrated and described, and the true scope and spirit of the invention are to be determined by reference to the following claims.

The embodiments of the invention in which an exclusive property or privilege is claimed are defined as follows:

1. An accelerometer comprising:
   a proof mass assembly including a reed suspended from a support for movement with respect thereto, and a first capacitor plate positioned on the reed;
   a stator; and
   an interface member positioned between the proof mass assembly and the stator, the interface member comprising a second capacitor plate positioned to form a capacitor with the first capacitor plate, the interface member further comprising mounting means for securely mounting a first area of the stator with respect to a corresponding first area of the support, and a mounting element extending between a second area of the stator and a corresponding second area of the support, the mounting element being relatively compliant along a first axis and relatively rigid along all other axes, the first axis being oriented such that it passes approximately through the mounting means.

2. The accelerometer of claim 1, wherein the mounting element is shaped such that it rotates in response to movement between the stator and the support along the first axis of the mounting element.

3. The accelerometer of claim 1, wherein the mounting element is mounted to the interface member by a torsion arm that permits rotation of the mounting element with respect to the interface member.

4. The accelerometer of claim 3, wherein the mounting element and torsion arm support the interface member such that the second capacitor plate is a predetermined distance from the first capacitor plate when the reed is at a null position.

5. The accelerometer of claim 1, wherein the support, the interface member, and the mounting element are all composed of fused quartz.

6. The accelerometer of claim 1, wherein the interface member comprises a generally planar, disk-shaped body having a central opening sized to accommodate a coil mounted to the reed.

* * * * *